United States Patent
Rocznik et al.

(10) Patent No.: US 8,114,684 B2
(45) Date of Patent: Feb. 14, 2012

(54) VERTICAL HALL EFFECT SENSOR WITH CURRENT FOCUS

(75) Inventors: Thomas Rocznik, Mountain View, CA (US); Christoph Lang, Cupertino, CA (US); Sam Kavusi, Menlo Park, CA (US)

(73) Assignee: Robert Bosch GmbH, Stuttgart (DE)

( * ) Notice: Subject to any disclaimer, the term of this patent is extended or adjusted under 35 U.S.C. 154(b) by 120 days.

(21) Appl. No.: 12/396,288

(22) Filed: Mar. 2, 2009

(65) Prior Publication Data

US 2010/0219810 A1    Sep. 2, 2010

(51) Int. Cl.
*H01L 29/82* (2006.01)
*H01L 21/8238* (2006.01)

(52) U.S. Cl. ............ 438/3; 438/199; 257/421; 257/424; 257/427

(58) Field of Classification Search .................. 257/421, 257/424, 425, 427, E43.003; 438/3, 199
See application file for complete search history.

(56) References Cited

U.S. PATENT DOCUMENTS

| | | | |
|---|---|---|---|
| 4,673,964 A | 6/1987 | Popovic et al. | |
| 4,929,993 A | 5/1990 | Popovic | |
| 5,476,804 A | 12/1995 | Lazzari | |
| 6,278,271 B1 * | 8/2001 | Schott | 324/251 |
| 7,253,490 B2 * | 8/2007 | Oohira | 257/424 |
| 2005/0230770 A1 | 10/2005 | Oohira | |

FOREIGN PATENT DOCUMENTS

JP    2006108528    4/2006

OTHER PUBLICATIONS

Javonovic et al., Simulation of Vertical Hall Sensor in High-voltage CMOS Technology, Telsiks, vol. 2, Oct. 2003 (4 pages).
International Search Report in corresponding PCT application (i.e., PCT/US2010/025758), mailed Jun. 9, 2010 (5 pages).
Paranjape M et al: "A CMOS-compatible 2-D vertical hall magnetic-field sensor using active carrier confinement and post-process micromachining" Sensors and Actuators A, Elsevier Sequoia S.A., Lausanne, CH, vol. 53, No. 1, May 1, 1996 , pp. 278-283, XP004018159 ISSN: 0924-4247 (6 pages).
E. Schurig, Highly Sensitive Vertical Hall Sensors in CMOS Technology, EPFL Thesis, No. 3134, 2004, 10 pages.
C. Schott, Accurate Magnetic Field Transducers Based on Silicon Hall Sensors, EPFL Thesis, No. 1985, 1999, 11 pages.

* cited by examiner

*Primary Examiner* — Michael Trinh
(74) *Attorney, Agent, or Firm* — Maginot, Moore & Beck

(57) ABSTRACT

A complementary metal oxide semiconductor (CMOS) sensor system in one embodiment includes a doped substrate, a doped central island extending downwardly within the doped substrate from an upper surface of the doped substrate, and a first doped outer island extending downwardly within the doped substrate from the upper surface of the doped substrate, the first outer island electrically isolated from the central island within an upper portion of the substrate, and electrically coupled to the central island within a lower portion of the substrate.

20 Claims, 6 Drawing Sheets

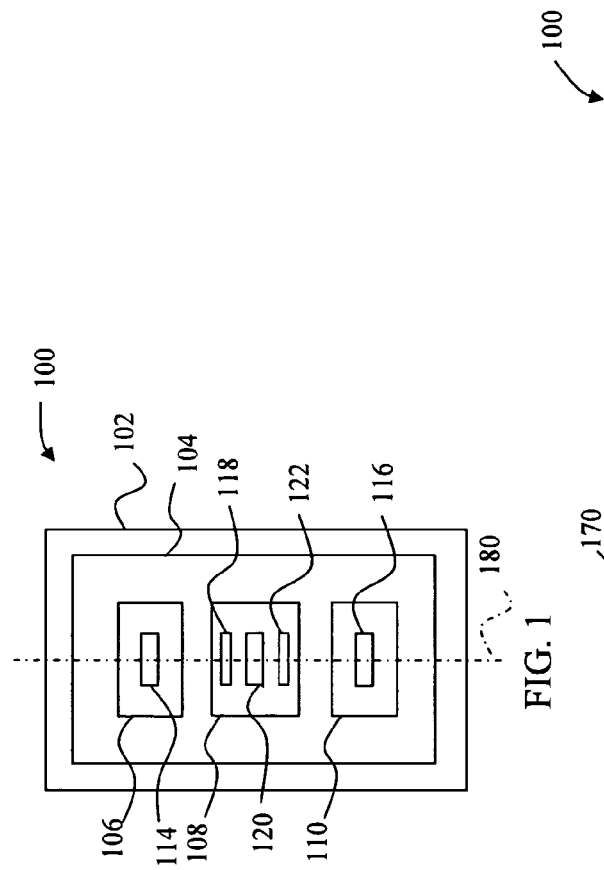
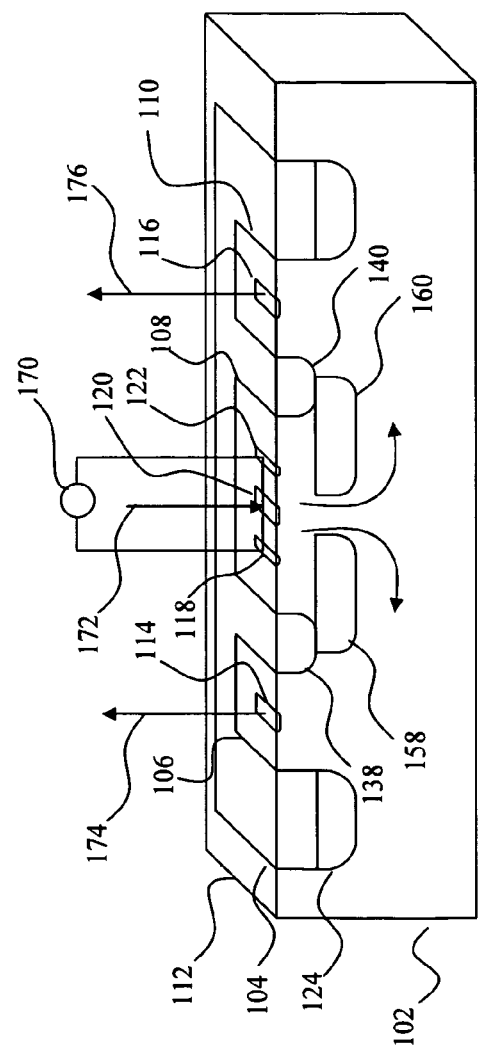

US 8,114,684 B2

VERTICAL HALL EFFECT SENSOR WITH CURRENT FOCUS

BACKGROUND

The invention relates to magnetic field sensors and more specifically to CMOS Hall Effect sensors.

BACKGROUND

Hall Effect sensors are among the most widely used magnetic sensors. Hall Effect sensors incorporate a Hall Effect plate, which is either an n– or p– doped area, supplied with bias current/voltage. In presence of a magnetic field the carriers that are moving in the doped area are deflected by the Lorentz force, and a Hall electrical field appears. The Hall voltage Vh appears across the positive and negative contacts of the Hall Effect plate. Front-end circuitry provided with the sensor converts the Hall voltage to a data indicative of the sensed magnetic field.

Magnetic detection by standard CMOS Hall devices is thus limited to the field perpendicular to the chip surface. In many scenarios, however, measurement of the magnetic field in two or even three dimensions is desired. Packaging sensors for measuring multiple dimensions of a magnetic field can be accomplished by packaging chips perpendicular to each other. This approach, however, requires the use of specialized technology during the manufacturing process and special alignment of the equipment resulting in increased manufacturing costs.

Alternatively, vertical Hall effect devices may be used. U.S. Pat. No. 4,929,993, issued on May 29, 1990 discloses one such device. In these devices, the current flows in the Z (out of plane) direction. These devices, however, exhibit low sensitivity, instability, and excessive cross-talk between different dimensions of the magnetic field. Yet another approach is to use a single chip with magnetic concentrators. This approach results in higher post processing costs and instability of the magnetic concentrator.

An out of plane sensor that can be combined with other circuits on a chip is beneficial. A packaged sensor capable of sensing the out of plane component of a magnetic field is useful. The ability to package a sensor capable of measuring more than one dimension of a magnetic field would also be useful. A method of manufacturing such a device in a commonly used semiconductor process, e.g. CMOS, would be beneficial.

SUMMARY

In accordance with one embodiment, a complementary metal oxide semiconductor (CMOS) sensor system includes a doped substrate, a doped central island extending downwardly within the doped substrate from an upper surface of the doped substrate, and a first doped outer island extending downwardly within the doped substrate from the upper surface of the doped substrate, the first outer island electrically isolated from the central island within an upper portion of the substrate, and electrically coupled to the central island within a lower portion of the substrate.

In accordance with another embodiment a method of forming a complementary metal oxide semiconductor (CMOS) sensor system includes doping a substrate, forming a doped central island extending downwardly within the doped substrate from an upper surface of the doped substrate, and forming a first doped outer island extending downwardly within the doped substrate from the upper surface of the doped substrate, the first outer island electrically isolated from the central island within an upper portion of the substrate, and electrically coupled to the central island within a lower portion of the substrate.

In yet another embodiment, a vertical Hall effect sensor system includes a first doped island extending downwardly into a substrate, a current supply contact doped into the first doped island, a first sensor device contact doped into the first doped island adjacent a first side of the current supply contact and located on a first axis extending through the current supply contact, a second sensor device contact doped into the first doped island at a location on the first axis adjacent a second side of the current supply contact, a second doped island extending downwardly into the substrate and located on the first axis, a first current return contact doped into the second doped island, a first doped leg positioned between the first doped island and the second doped island, the first doped leg inhibiting electrical flow between the first doped island and the second doped island, and a doped connector extending beneath the first doped leg and electrically coupling the first doped island and the second doped island.

BRIEF DESCRIPTION OF DRAWINGS

FIG. 1 depicts a top plan view of a sensor configured to detect a component of a magnetic field that is parallel to the surface of the sensor and perpendicular to the centerline of the sensor;

FIG. 2 depicts a perspective cutaway view along the centerline of the sensor of FIG. 1 showing the extended current path within an island created by selective doping of a substrate;

DESCRIPTION

Figure 3:
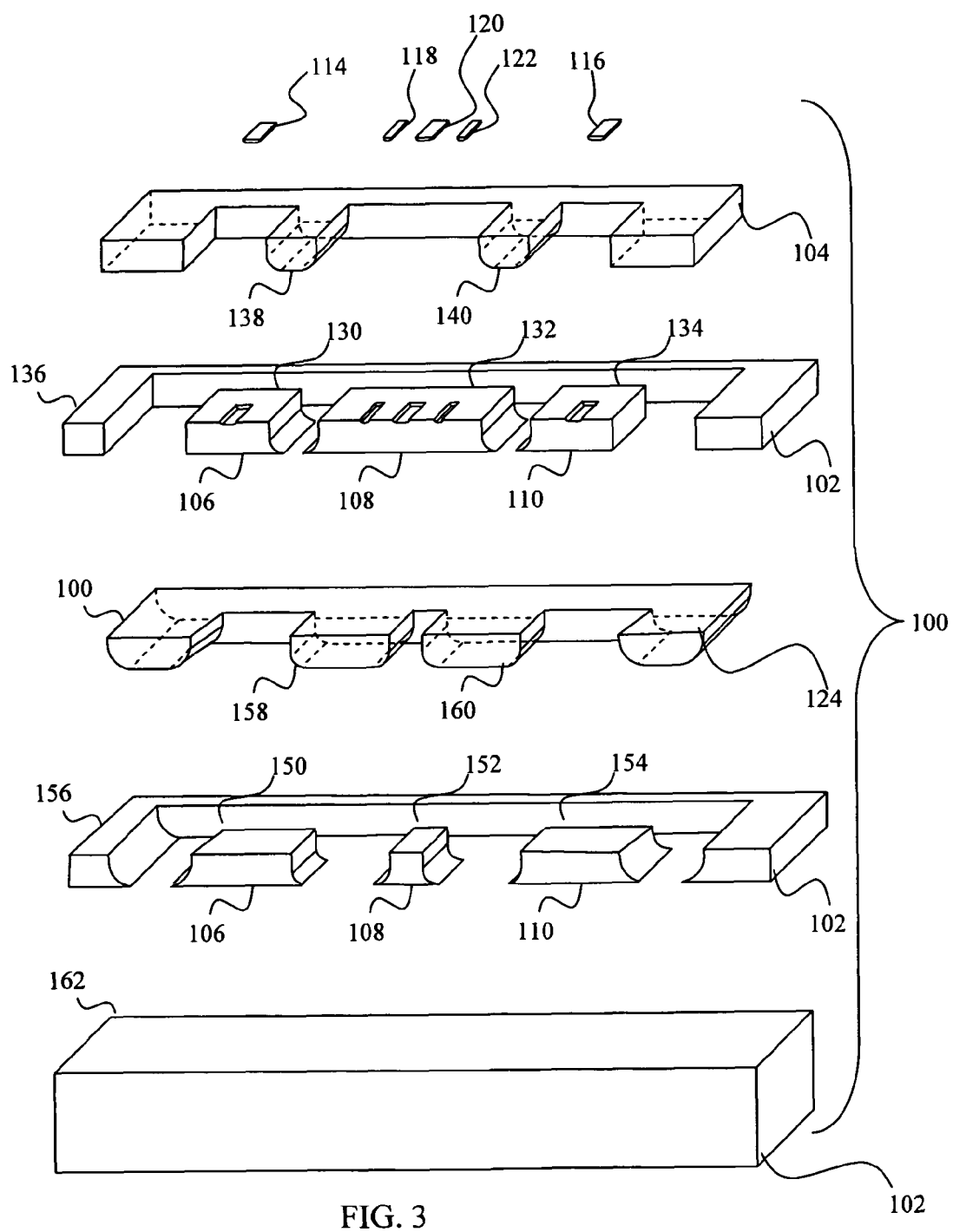
FIG. 3 depicts an exploded view of a cutaway portion the sensor of FIG. 1 with the substrate separated to show different layers of the substrate and different doping within the layers.

A vertical Hall Effect sensor 100 is depicted in FIGS. 1-2. The sensor 100 is formed in a substrate 102 which in this embodiment is p– doped. The doping of the substrate 102 and the other components of the sensor 100 may be reversed if desired.

Within the p– doped substrate 102, an n– doped well 104 defines three islands 106, 108 and 110 at the upper surface 112 of the of the p– doped substrate 102. P+ doped contacts 114 and 116 are located within the islands 106 and 110, respectively. P+ doped contacts 118, 120, and 122 are located within the island 108. A second n– doped well 124 is buried below the n– doped well 104.

As further illustrated in FIG. 3, upper portions 130, 132, and 134 of the islands 106, 108 and 110, respectively, extend downwardly from the upper surface 112 of the substrate 102 within an upper portion 136 of the substrate 102. Within the upper portion 136, a leg 138 of the n– doped well 104 separates the islands 106 and 108, while a leg 140 of the n– doped well 104 separates the islands 108 and 110.

Mid portions 150, 152, and 154 of the islands 106, 108 and 110, respectively, extend downwardly from the upper portion 136 of the substrate 102 within a middle portion 156 of the substrate 102. Within the middle portion 156, a leg 158 of the n– doped well 124 separates the islands 106 and 108, while a leg 160 of the n– doped well 124 separates the islands 108 and 110. Each of the islands 106, 108 and 110 are joined to the other of the islands 106, 108 and 110 by a base portion 162 of the substrate 102.

In operation, a Hall voltage measuring device 170 is positioned across the contacts 118 and 122. The Hall voltage measuring device 170 may be a circuit on the substrate 102 or an off chip device which amplifies the Hall voltage. Next, a current is supplied to the contact 120 as indicated by the arrow 172 in FIG. 2 with a return path (arrow 174) provided through the contact 114. Another return path (arrow 176) is provided through the contact 116.

The current flow within the substrate 102 is controlled by the n– doped well 104 and the n– doped well 124. Specifically, the leg 138 and the leg 158 of the n– doped wells 104 and 124, respectively, form a barrier from the upper surface 112 through the upper portion 136 and the middle portion 156 of the substrate 102 between the islands 106 and 108. Similarly, the leg 140 and the leg 160 of the n– doped wells 104 and 124, respectively, form a barrier from the upper surface 112 through the upper portion 136 and the middle portion 156 of the substrate 102 between the islands 108 and 110.

Accordingly, the current entering the substrate 102 at the contact 120 is forced to travel through the upper portion 132, the mid portion 152 and into the base portion 162 before splitting and proceeding to the contacts 114 and 116.

Therefore, in the presence of a magnetic field with a component that is parallel to the upper surface 112 and perpendicular to the centerline 180 of the sensor 100, the Lorentz force influences the path of the current travelling within the island 108. For example, in n type doped materials the electrons, depending upon the direction of the magnetic field, may be forced toward the leg 138 and the leg 158, or toward the leg 140 and the leg 160. The extended travel path of the current within the island 108 forced by the legs 138, 158, 140, and 160 allow increased divergence of the travel paths of the electrons or holes within the island 108.

Accordingly, a Hall voltage is generated between the contact 118 and the contact 122. The generated Hall voltage is then detected by the Hall voltage measuring device 170.

Figure 4:
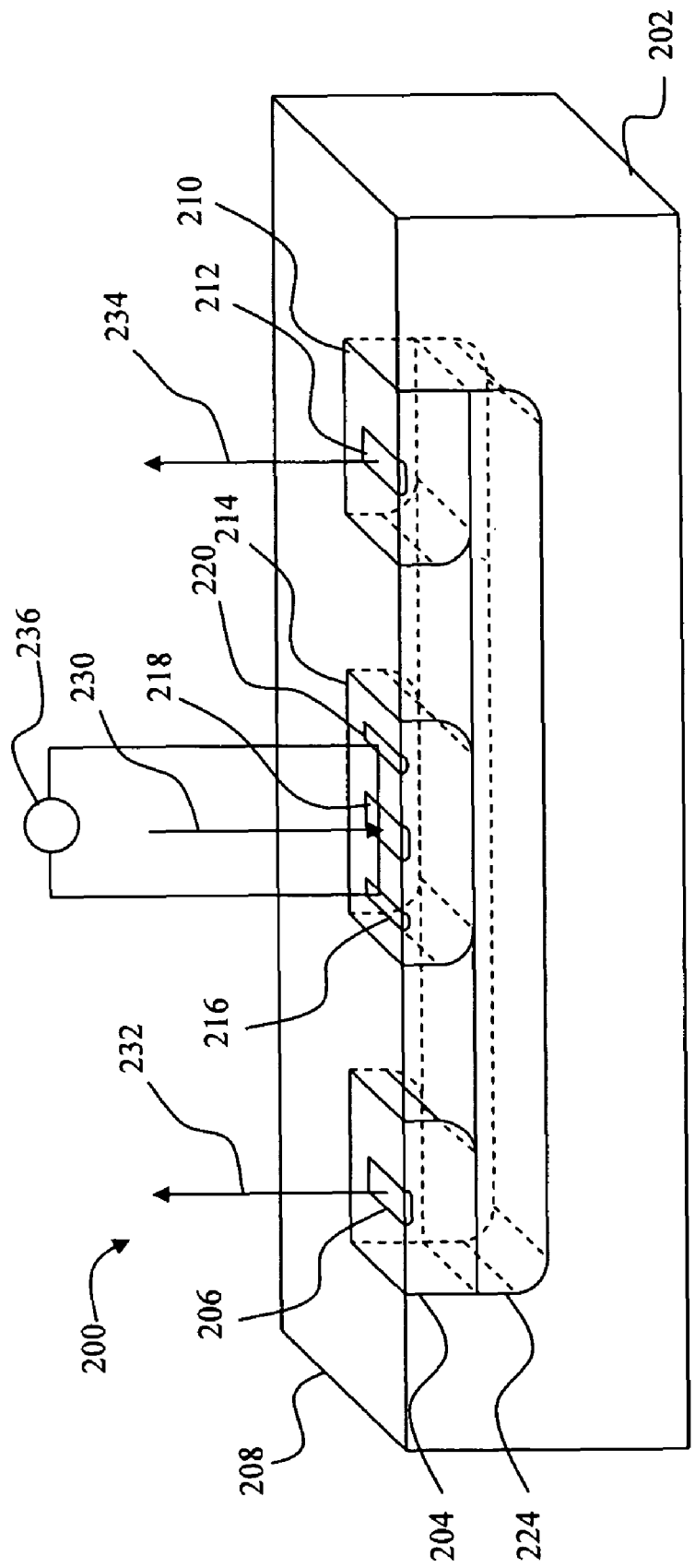
FIG. 4 depicts a perspective cutaway view of another embodiment of a sensor configured to measure the components of a magnetic field that are parallel to the upper surface of the sensor and perpendicular to a buried doped well which insulates the current used to detect a magnetic field from other currents within the substrate.

The sensor 100 may be influenced by extraneous currents within the substrate 102. In applications wherein such influence is not desired, an insulated sensor 200 shown in FIG. 4 may be used. The sensor 200 is formed in a substrate 202 which in this embodiment is p– doped. The doping of the substrate 202 and the other components of the sensor 200 may be reversed if desired.

Within the p– doped substrate 202, an n– doped well 204 is formed as an island in the substrate 202. An n+ doped contact 206 is formed at the upper surface 208 of the sensor 200 within the n– doped well 204. A second n– doped well 210 is formed as an island in the substrate 202. An n+ doped contact 212 is formed at the upper surface 208 of the sensor 200 within the n– doped well 210. A third island is formed as an n– doped well 214 at a location between the n– doped wells 204 and 210. Three n+ doped contacts 216, 218, and 220 are formed at the upper surface 208 within the n– doped well 214. A buried n– doped well 224 is formed as a base connecting the n– doped wells 204, 210, and 214.

The sensor 200 functions similarly to the sensor 100. Thus, after current is applied to the contact 218, as indicated by the arrow 230 in FIG. 4, the current travels downwardly within the island (the n– doped well 214). Rather than travelling within the substrate 202 to get to the contacts 206 and 212, however, the current splits and travels within the buried n– doped well 224 to the n– doped wells 204 and 210. Thus, the current is insulated from any currents within the substrate 202. Thereafter, the current exits through the contacts 206 and 212 as indicated by the arrows 232 and 234, respectively.

Consequently, in the presence of a magnetic field with a component that is parallel to the upper surface 228, and perpendicular to the axis defined by the buried n– doped well 224, the Lorentz force influences the path of the current travelling within the buried n– doped well 214. For example, in n type doped materials the electrons, depending upon the direction of the magnetic field, may be forced toward the n– doped well 204, or toward the n– doped well 210.

Accordingly, a Hall voltage is generated between the contact 216 and the contact 220. Consequently, the Hall voltage that is established between the contact 216 and the contact 220 is detected by a Hall voltage measuring device 236 connected to the contact 216 and the contact 220. Thus, a magnetic field may be detected while insulating the current used to detect the magnetic field from spurious currents within the substrate 202.

Figure 5:
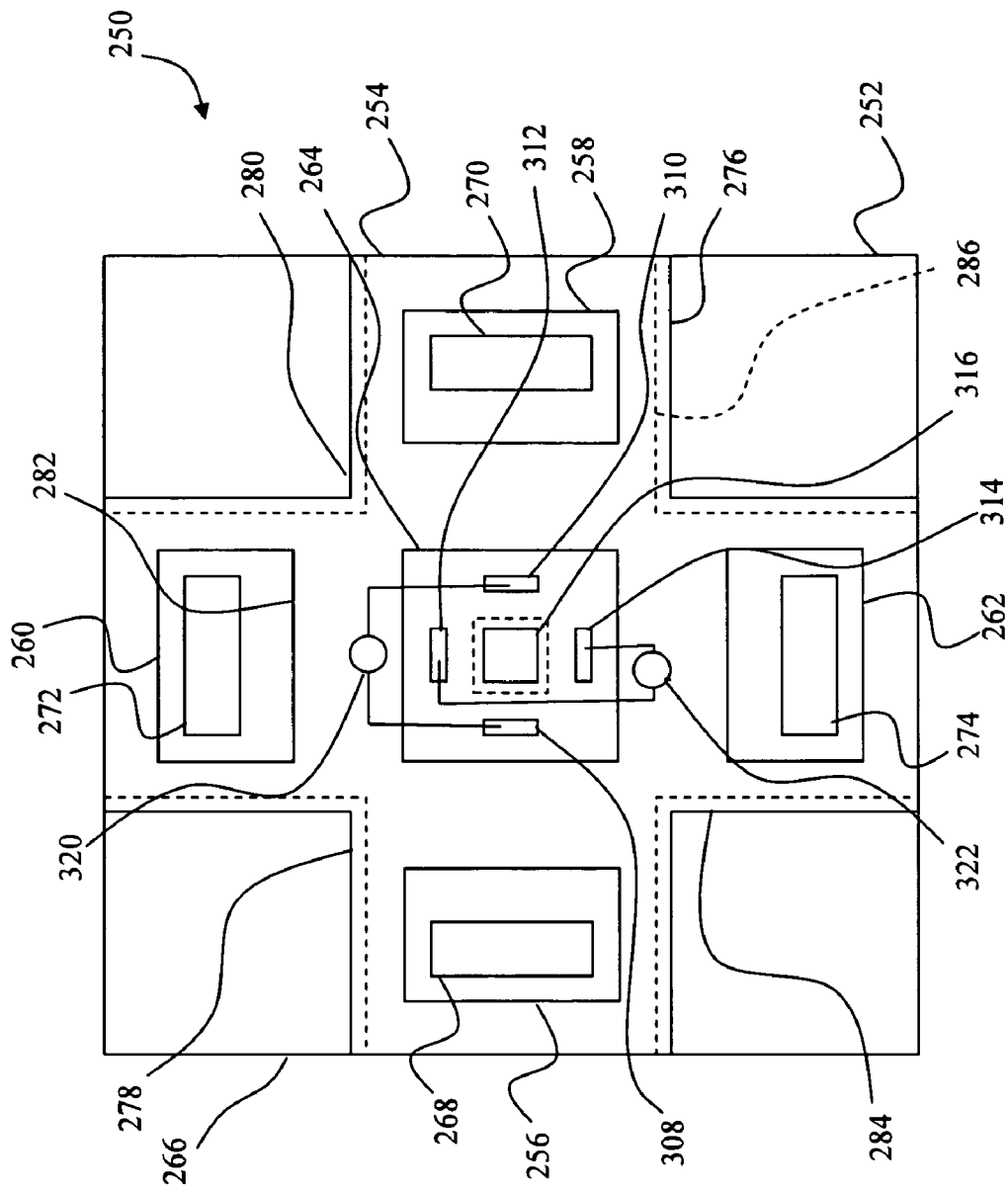
FIG. 5 depicts a top plan view of a sensor configured to detect components of a magnetic field in both the x-axis and the y-axis.
Figure 6:
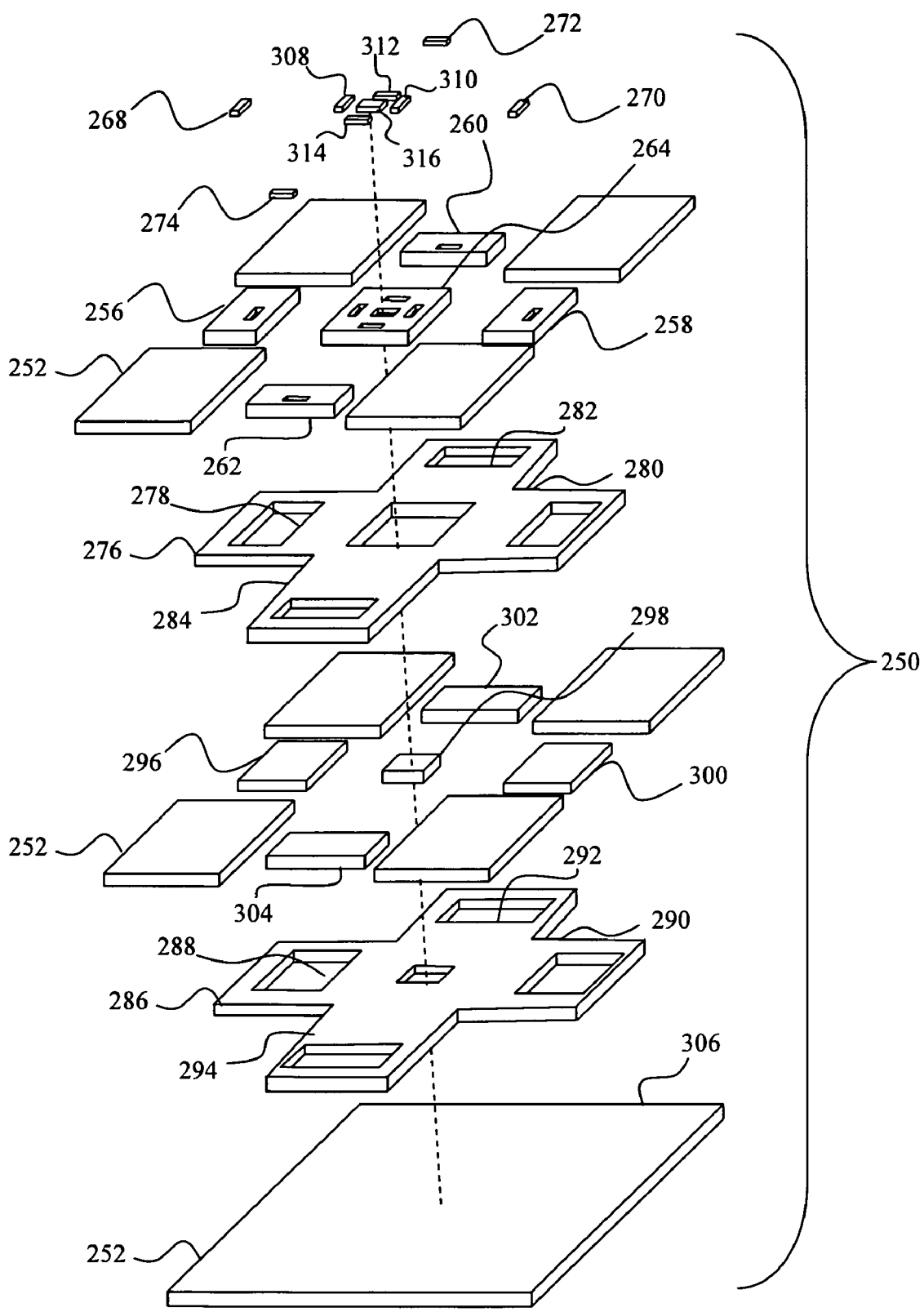
FIG. 6 depicts an exploded view of a cutaway portion the sensor of FIG. 5 with the substrate separated to show different layers of the substrate and different doping within the layers.

A further embodiment of a sensor 250 is depicted in FIGS. 5 and 6. The sensor 250 is formed in a substrate 252 which in this embodiment is p– doped. The doping of the substrate 252 and the other components of the sensor 250 may be reversed if desired.

Within the p– doped substrate 252, four outer p– doped islands 256, 258, 260 and 262, and an inner p– doped island 264 are located at the upper surface 266 of the substrate 252. Within each of the outer p– doped islands 256, 258, 260 and 262 is located a p+ doped contact 268, 270, 272, and 274, respectively. An n– doped well 276 is also located at the upper surface 266. The n– doped well 276 includes four legs 278, 280, 282, and 284. The leg 278 separates the island 256 from the island 264, leg 280 separates the island 258 from the island 264, leg 282 separates the island 260 from the island 264, and leg 284 separates the island 262 from the island 264.

Below the n– doped well 276 is a second n– doped well 286. The n– doped well 286 includes four legs 288, 290, 292, and 294. The leg 288 separates middle portion 296 of the island 256 from the middle portion 298 of the island 264, leg 290 separates middle portion 300 of the island 258 from the middle portion 298 of the island 264, leg 292 separates middle portion 302 of the island 260 from the middle portion 298 of the island 264, and leg 294 separates middle portion 304 of the island 266 from the middle portion 298 of the island 264.

A base portion 306 of the substrate 252 connects each of the islands 256, 258, 260, 262, and 264. At the upper surface 266 of the island 164, four p+ doped contacts 308, 310, 312, and 314 are located about a central p+ doped contact 316.

The sensor 250 functions in substantially the same manner as the sensor 100, with current applied to the contact 316 travelling downwardly within the island 264 because of the n– doped wells 276 and 286. When the current reaches the base portion 306, however, the current is split in four components, with one current component travelling to and through each of the islands 256, 258, 260, and 262, respectively, and out of the respective contacts 268, 270, 272, and 274. Thus, by appropriately sizing the contacts 268, 270, 272, 274, and 316, the current passing through the island 264 can be maximized.

Another difference in operation is that instead of a single Hall voltage measuring device, two Hall voltage measuring devices 320 and 322 are provided. The Hall voltage measuring device 320 is connected to the contacts 308 and 310. Therefore, in the presence of a magnetic field with a component that is parallel to the upper surface 266 and perpendicular to an axis on the upper surface passing through the center of the islands 256 and 258, the Lorentz force influences the path of the current travelling within the island 264. For example, in n type doped materials the electrons, depending upon the direction of the magnetic field, may be forced toward the leg 278 and the leg 288, or toward the leg 280 and the leg 290. The extended travel path of the current within the island 264 forced by the legs 278, 280, 282, 284, 288, 290, 292, and 294 allow increased divergence of the travel paths of the electrons and holes within the island 264.

Accordingly, a Hall voltage is generated between the contact 308 and the contact 310. The generated Hall voltage is then detected by the Hall voltage measuring device 320.

Additionally, the Hall voltage measuring device 322 is connected to the contacts 312 and 314. Therefore, in the presence of a magnetic field with a component that is parallel to the upper surface 266 and perpendicular to an axis on the upper surface passing through the center of the islands 260 and 262, the Lorentz force influences the path of the current travelling within the island 264. For example, in n type doped materials the electrons, depending upon the direction of the magnetic field, may be forced toward the leg 284 and the leg 294, or toward the leg 282 and the leg 292. The extended travel path of the current within the island 264 forced by the legs 278, 280, 282, 284, 288, 290, 292, and 294 allow increased divergence of the travel paths of the electrons and holes within the island 264.

Accordingly, a Hall voltage is generated between the contact 312 and the contact 314. The generated Hall voltage is then detected by the Hall voltage measuring device 322.

The sensor 250 is thus capable of sensing magnetic fields along both the x-axis and the y-axis of the sensor 250. As such, the sensor 250 may be used in various applications such as, but not limited to, a complementary metal oxide semiconductor (CMOS) compass, a sensor for detecting and measuring the components of a magnetic field generated by different magnetic sources, and the detection of a magnetic bead fielding order to detect a cell or molecule.

Figure 7:
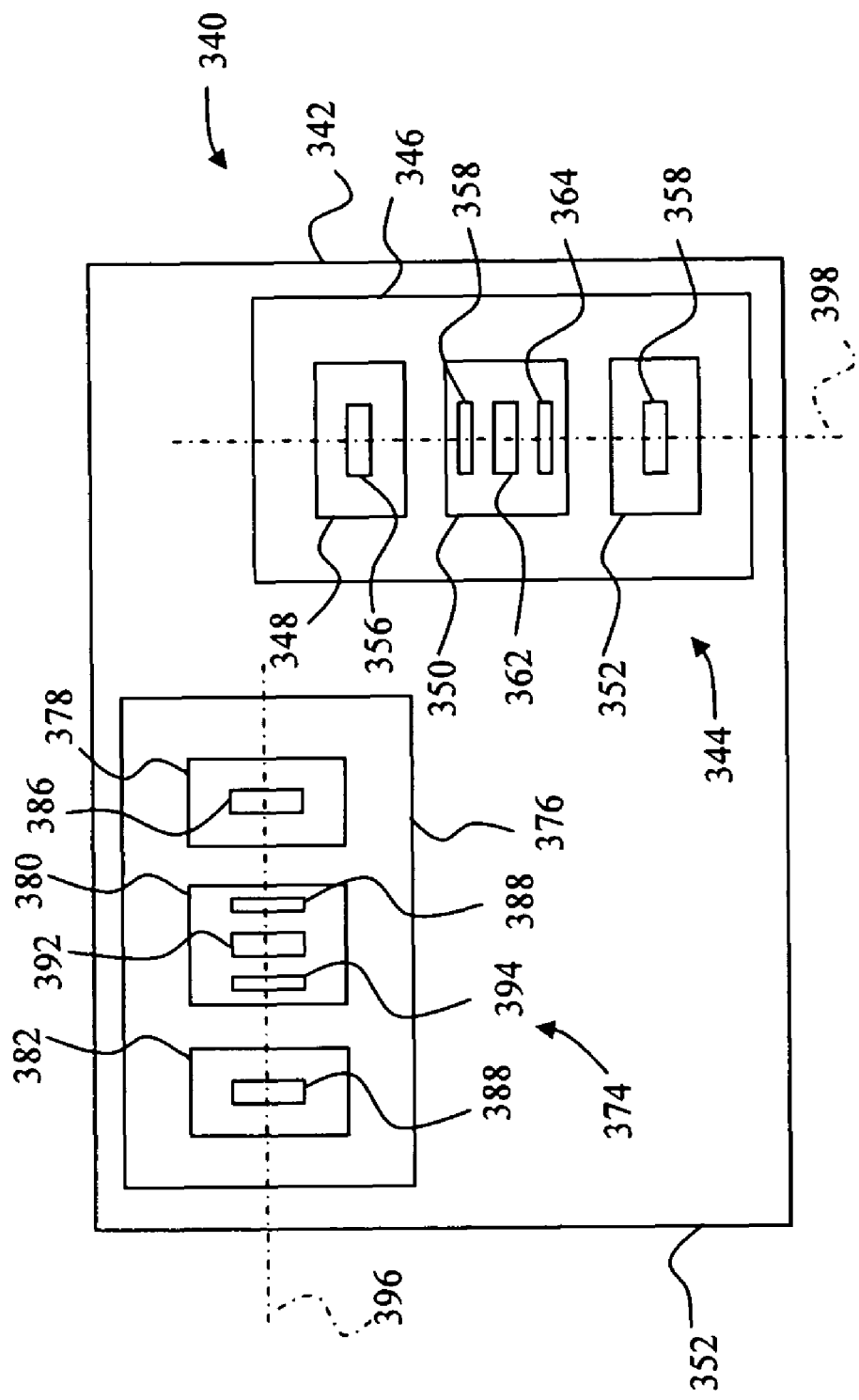
FIG. 7 depicts a top plan view of an alternative embodiment of a sensor configured to detect components of a magnetic field in both the x-axis and the y-axis.

An alternative arrangement capable of sensing magnetic fields along both the x-axis and the y-axis is shown in FIG. 7. The sensor assembly 340 is formed in a substrate 342 which in this embodiment is p– doped. The doping of the substrate 342 and the other components of the sensor 340 may be reversed if desired.

Within the p– doped substrate 342, a first sensor 344 includes an n– doped well 346 defines three islands 348, 350 and 352 at the upper surface 354 of the of the p– doped substrate 342. P+ doped contacts 356 and 358 are located within the islands 348 and 352, respectively. P+ doped contacts 360, 362, and 364 are located within the island 350. A second n– doped well 366 is buried below the n– doped well 346. The sensor 344 functions in a manner substantially the same as the sensor 100 described above.

The sensor assembly 340 further includes a second sensor 374. The sensor 374 includes an n– doped well 376 defines three islands 378, 380 and 382 at the upper surface 354 of the of the p– doped substrate 342. P+ doped contacts 386 and 388 are located within the islands 378 and 382, respectively. P+ doped contacts 390, 392, and 394 are located within the island 380. A second n– doped well 396 is buried below the n– doped well 376. The sensor 374 functions in a manner substantially the same as the sensor 344. The axis 396 of the sensor 274, however, is perpendicular to the axis 398 of the sensor 344. Accordingly, the sensor assembly 340 can sense magnetic fields along both the x-axis and the y-axis. Moreover, the sensors 374 and 344 are isolated from one another.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A complementary metal oxide semiconductor (CMOS) sensor system, comprising:
   a doped substrate;
   a doped central island extending downwardly within the doped substrate from an upper surface of the doped substrate;
   a first doped outer island extending downwardly within the doped substrate from the upper surface of the doped substrate, the first outer island electrically isolated from the central island within an upper portion of the substrate, and electrically coupled to the central island within a lower portion of the substrate; and
   a first buried doped well within a mid portion of the substrate, the first buried doped well electrically isolating each of the first outer island and the central island from the other of the first outer island and the central island within the mid portion of the substrate, the first buried doped well configured such that at least a portion of the first buried doped well is not directly beneath any portion within the upper portion of the substrate that electrically isolates the first outer island from the central island.

2. The sensor system of claim 1, further comprising:
   a first doped contact within the central island;
   a second doped contact within the central island; and
   a Hall voltage measuring device connected to the first doped contact and the second doped contact.

3. The sensor system of claim 1, further comprising:
   a second doped outer island extending downwardly within the doped substrate from the upper surface of the doped substrate, the second outer island electrically isolated from the first outer island and the central island within the upper portion of the substrate, and electrically coupled to the central island within the lower portion of the substrate.

4. The sensor system of claim 3, wherein the first buried doped well electrically isolates each of the first outer island, the second outer island, and the central island from the other of the first outer island, the second outer island, and the central island within the mid portion of the substrate.

5. The sensor system of claim 3, further comprising:
   a third doped outer island extending downwardly within the doped substrate from the upper surface of the doped substrate, the third outer island electrically isolated from the first outer island, the second outer island, and the central island within the upper portion of the substrate, and electrically coupled to the central island within the lower portion of the substrate; and
   a fourth doped outer island extending downwardly within the doped substrate from the upper surface of the doped substrate, the fourth outer island electrically isolated from the first outer island, the second outer island, the third outer island, and the central island within the upper portion of the substrate, and electrically coupled to the central island within the lower portion of the substrate.

6. The sensor system of claim 5, wherein:
   the first outer island, the second outer island, and the central island define a first axis along the surface of the substrate;

the third outer island, the fourth outer island, and the central island define a second axis along the surface of the substrate; and the first axis is substantially orthogonal to the second axis.

7. The sensor system of claim 6, further comprising:
a first doped contact on the first axis within the central island;
a second doped contact on the first axis and spaced apart from the first doped contact within the central island;
a first Hall voltage measuring device connected to the first doped contact and the second doped contact;
a third doped contact on the second axis within the central island;
a fourth doped contact on the second axis and spaced apart from the third doped contact within the central island; and
a second Hall voltage measuring device connected to the third doped contact and the fourth doped contact.

8. The sensor system of claim 5, wherein the first buried doped well electrically isolates each of the first outer island, the second outer island, the third outer island, the fourth outer island, and the central island from the other of the first outer island, the second outer island, the third outer island, the fourth outer island, and the central island within the mid portion of the substrate.

9. The sensor system of claim 7, wherein the first buried doped well electrically isolates each of the first outer island, the second outer island, the third outer island, the fourth outer island, and the central island from the other of the first outer island, the second outer island, the third outer island, the fourth outer island, and the central island within the mid portion of the substrate.

10. The sensor system of claim 1, wherein at least a portion of the central island overlies at least a portion of the first buried doped well.

11. The sensor system of claim 10, wherein at least a portion of the central island closest to the first doped outer island overlies the at least a portion of the first buried doped well.

12. A method of forming a complementary metal oxide semiconductor (CMOS) sensor system, comprising:
doping a substrate;
forming a doped central island extending downwardly within the doped substrate from an upper surface of the doped substrate;
forming a first doped outer island extending downwardly within the doped substrate from the upper surface of the doped substrate, the first outer island electrically isolated from the central island within an upper portion of the substrate, and electrically coupled to the central island within a lower portion of the substrate; and
forming a first buried doped well within a mid portion of the substrate, the first buried doped well electrically isolating each of the first outer island and the central island from the other of the first outer island and the central island within the mid portion of the substrate and at least a portion of the central island overlying at least a portion of the first buried doped well.

13. The method of claim 12, further comprising:
forming a first doped contact within the central island;
forming a second doped contact within the central island; and
connecting a Hall voltage measuring device to the first doped contact and the second doped contact.

14. The method of claim 12, further comprising:
forming a second doped outer island extending downwardly within the doped substrate from the upper surface of the doped substrate, the second outer island electrically isolated from the first outer island and the central island within the upper portion of the substrate, and electrically coupled to the central island within the lower portion of the substrate.

15. The method of claim 14, wherein the first buried doped well electrically isolates each of the first outer island, the second outer island, and the central island from the other of the first outer island, the second outer island, and the central island within the mid portion of the substrate.

16. The sensor system of claim 14, further comprising:
forming a third doped outer island extending downwardly within the doped substrate from the upper surface of the doped substrate, the third outer island electrically isolated from the first outer island, the second outer island, and the central island within the upper portion of the substrate, and electrically coupled to the central island within the lower portion of the substrate; and
forming a fourth doped outer island extending downwardly within the doped substrate from the upper surface of the doped substrate, the fourth outer island electrically isolated from the first outer island, the second outer island, the third outer island, and the central island within the upper portion of the substrate, and electrically coupled to the central island within the lower portion of the substrate.

17. The method of claim 16, wherein:
the first outer island, the second outer island, and the central island are formed along a first axis along the surface of the substrate;
the third outer island, the fourth outer island, and the central island are formed along a second axis along the surface of the substrate; and
the first axis is substantially orthogonal to the second axis.

18. The method of claim 17, further comprising:
forming a first doped contact on the first axis within the central island;
forming a second doped contact on the first axis and spaced apart from the first doped contact within the central island;
connecting a first Hall voltage measuring device to the first doped contact and the second doped contact;
forming a third doped contact on the second axis within the central island;
forming a fourth doped contact on the second axis and spaced apart from the third doped contact within the central island; and
connecting a second Hall voltage measuring device to the third doped contact and the fourth doped contact.

19. The method of claim 16, wherein the first buried doped well electrically isolates each of the first outer island, the second outer island, the third outer island, the fourth outer island, and the central island from the other of the first outer island, the second outer island, the third outer island, the fourth outer island, and the central island within the mid portion of the substrate.

20. The method of claim 18, wherein the first buried doped well electrically isolates each of the first outer island, the second outer island, the third outer island, the fourth outer island, and the central island from the other of the first outer island, the second outer island, the third outer island, the fourth outer island, and the central island within the mid portion of the substrate.

* * * * *